United States Patent
Benten

(10) Patent No.: US 8,804,434 B2
(45) Date of Patent: Aug. 12, 2014

(54) PULSE-BASED MEMORY READ-OUT

(75) Inventor: Harold Gerardus Pieter Hendrikus Benten, Eindhoven (NL)

(73) Assignee: NXP, B.V., Eindhoven (NL)

(*) Notice: Subject to any disclaimer, the term of this patent is extended or adjusted under 35 U.S.C. 154(b) by 294 days.

(21) Appl. No.: 13/468,869

(22) Filed: May 10, 2012

(65) Prior Publication Data

US 2013/0301362 A1    Nov. 14, 2013

(51) Int. Cl.
*G11C 11/34* (2006.01)

(52) U.S. Cl.
USPC ............ 365/185.23; 365/189.14; 365/189.05; 365/189.16

(58) Field of Classification Search
USPC .............. 365/185.23, 189.05, 189.14, 189.16
See application file for complete search history.

(56) References Cited

U.S. PATENT DOCUMENTS

| 6,414,874 | B2* | 7/2002 | Akaogi | 365/185.11 |
| 8,102,696 | B2* | 1/2012 | Katoh et al. | 365/148 |
| 2006/0221734 | A1 | 10/2006 | Bedeschi et al. | |

OTHER PUBLICATIONS

Extended European Search Report for Patent Appln. No. 13160104.9 (Jul. 16, 2013).

* cited by examiner

*Primary Examiner* — Son Dinh

(57) ABSTRACT

A pulse-based memory read-out device, including: a pulse generator at a first end of a bit line and a detector at a second end of the bit line. The pulse generator is configured to send an electrical pulse along the bit line from the first end of the bit line. The detector is configured to: detect the electrical pulse at the second end; and output a digital signal representing a current state of a selected memory cell in the bit line, wherein the digital signal is based on an amplitude of the electrical pulse at the second end.

20 Claims, 4 Drawing Sheets

PULSE-BASED MEMORY READ-OUT

In flash memory, memory cells are arranged in a memory array that includes rows (word lines) and columns (bit lines). A flash memory device can contain many memory cells in a very small, dense area. Consequently, the speed of the flash memory device may be largely dependent on the complexity and speed at which the device is able to access the memory cells. Each memory cell in the array may be accessible for writing or reading individually.

To select one or more cells for reading out a current state, the appropriate row and column containing the specified cells are selected. Typically, a single flash memory cell includes one or more transistors. Each memory cell is capable of being in either of two states—a low threshold voltage (Vt) or a high threshold voltage. Detection of the state of a cell is generally done by detecting the amount of current flowing through the cell. The cell current is comparatively high when the cell has low-Vt, and comparatively low when the cell has high-Vt due to the different amounts of current that pass through the memory cells in each state.

Because memory cells sink different amounts of current when the memory cells have low-Vt than when the memory cells have high-Vt, a detector or sensor may be able to use such information to determine the current state of the memory cells when applying a current or voltage to the bit line on which the memory cells are located. Additionally, due to the large number of memory cells in such a memory array, the speed and accuracy at which the states of the memory cells are identified during read-out has a significant effect on the overall speed and performance of the flash memory.

Embodiments of a device are described. In one embodiment, the device is a pulse-based memory read-out device. The device includes: a pulse generator at a first end of a bit line, wherein the pulse generator is configured to send an electrical pulse along the bit line from the first end of the bit line; and a detector at a second end of the bit line, wherein the detector is configured to: detect the electrical pulse at the second end; and output a digital signal representing a current state of a selected memory cell in the bit line, wherein the digital signal is based on an amplitude of the electrical pulse at the second end. Other embodiments of the device are also described.

In one embodiment of a device, the device is a flash storage device. The device includes: an array of memory cells, wherein the memory cells are arranged in columns of bit lines and rows of word lines; a pulse generator at a first end of each bit line, wherein each of the pulse generators is configured to send an electrical pulse along one of the bit lines from the first end of the bit line corresponding to the selected memory cell; and a detector at a second end of each bit line, wherein each detector is configured to: detect the electrical pulse at the second end of the corresponding bit line; and output a digital signal representing a current state of the selected memory cell, wherein the digital signal is based on a voltage level of the electrical pulse at the second end of the corresponding bit line. Other embodiments of the method are also described.

Embodiments of a method are described. In one embodiment, the method is a method for reading out a flash memory device. The method includes: generating an electrical pulse at a first end of a bit line, wherein the bit line comprises a selected memory cell between the first end and a second end of the bit line; detecting the electrical pulse at the second end via a detector; and outputting a digital signal representing a current state of the selected memory cell, wherein the digital signal is based on an amplitude of the electrical pulse at the second end. Other embodiments of a system are also described.

Other aspects and advantages of embodiments of the present invention will become apparent from the following detailed description, taken in conjunction with the accompanying drawings, illustrated by way of example of the principles of the invention.

Throughout the description, similar reference numbers may be used to identify similar elements.

Figure 1:
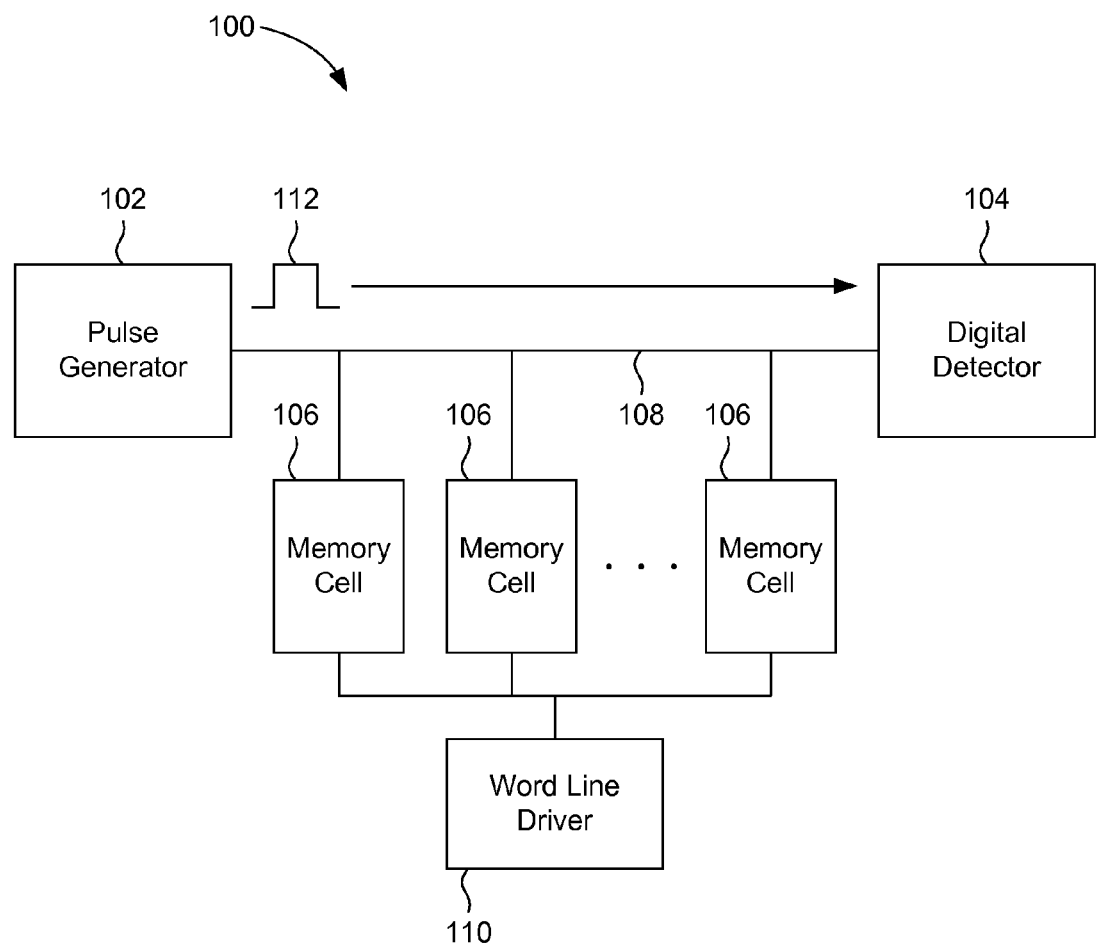
FIG. 1 depicts a schematic diagram of one embodiment of a pulse-based memory read-out device.

It will be readily understood that the components of the embodiments as generally described herein and illustrated in the appended figures could be arranged and designed in a wide variety of different configurations. Thus, the following more detailed description of various embodiments, as represented in the figures, is not intended to limit the scope of the present disclosure, but is merely representative of various embodiments. While the various aspects of the embodiments are presented in drawings, the drawings are not necessarily drawn to scale unless specifically indicated.

The present invention may be embodied in other specific forms without departing from its spirit or essential characteristics. The described embodiments are to be considered in all respects only as illustrative and not restrictive. The scope of the invention is, therefore, indicated by the appended claims rather than by this detailed description. All changes which come within the meaning and range of equivalency of the claims are to be embraced within their scope.

Reference throughout this specification to features, advantages, or similar language does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussions of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize, in light of the description herein, that the invention can be practiced without one or more of the specific features or advantages of a particular embodiment. In other instances, additional features and advantages may be recognized in certain embodiments that may not be present in all embodiments of the invention.

Reference throughout this specification to "one embodiment," "an embodiment," or similar language means that a particular feature, structure, or characteristic described in connection with the indicated embodiment is included in at least one embodiment of the present invention. Thus, the phrases "in one embodiment," "in an embodiment," and similar language throughout this specification may, but do not necessarily, all refer to the same embodiment.

While many embodiments are described herein, at least some of the described embodiments present a system and method for reading out data stored in a flash memory device. More specifically, the system uses a pulse generator to generate a pulse at a first end of a bit line corresponding to a selected memory cell, and detecting the pulse at a second end of the bit line. The detector outputs a digital signal that represents the current state of the selected memory cell. The outputted signal is based on the amplitude of the electrical pulse that is sensed by the detector as compared to the amplitude of the electrical pulse at the first end of the bit line.

Many conventional systems use a sense amplifier or other sensing circuit that biases the drain of each flash cell via the bit line and compares the cell current with a reference current to determine the state of the cell. These sense amplifiers tend to be relatively complex analogue circuits that must be capable of charging the bit line to an appropriate level, regulating that level during the read-out process, and comparing the cell current to a reference current to determine the state of the memory cell. The reference current must be between the high and low cell current at the end of the life time of the flash cell. This tends to be a non-trivial requirement in view of process spread and cell degradation during the lifetime of the product. The design and manufacture of such analogue circuits can be complex because many important technical aspects must be taken into account, such as electrical stability (to prevent oscillations) and device matching (the reference current used for the comparison with the cell current must be as identical as possible in each individual sense amplifier).

A system and method for determining the state of the flash cell that uses simple digital circuits rather than complex analogue circuits such as a sense amplifier may decrease production and manufacturing costs. Such a system and method may decrease the complexity of the flash read-out circuits while providing fast and accurate read-out of flash memory cells in a complimentary metal-oxide-semiconductor (CMOS) system.

Figure 5:
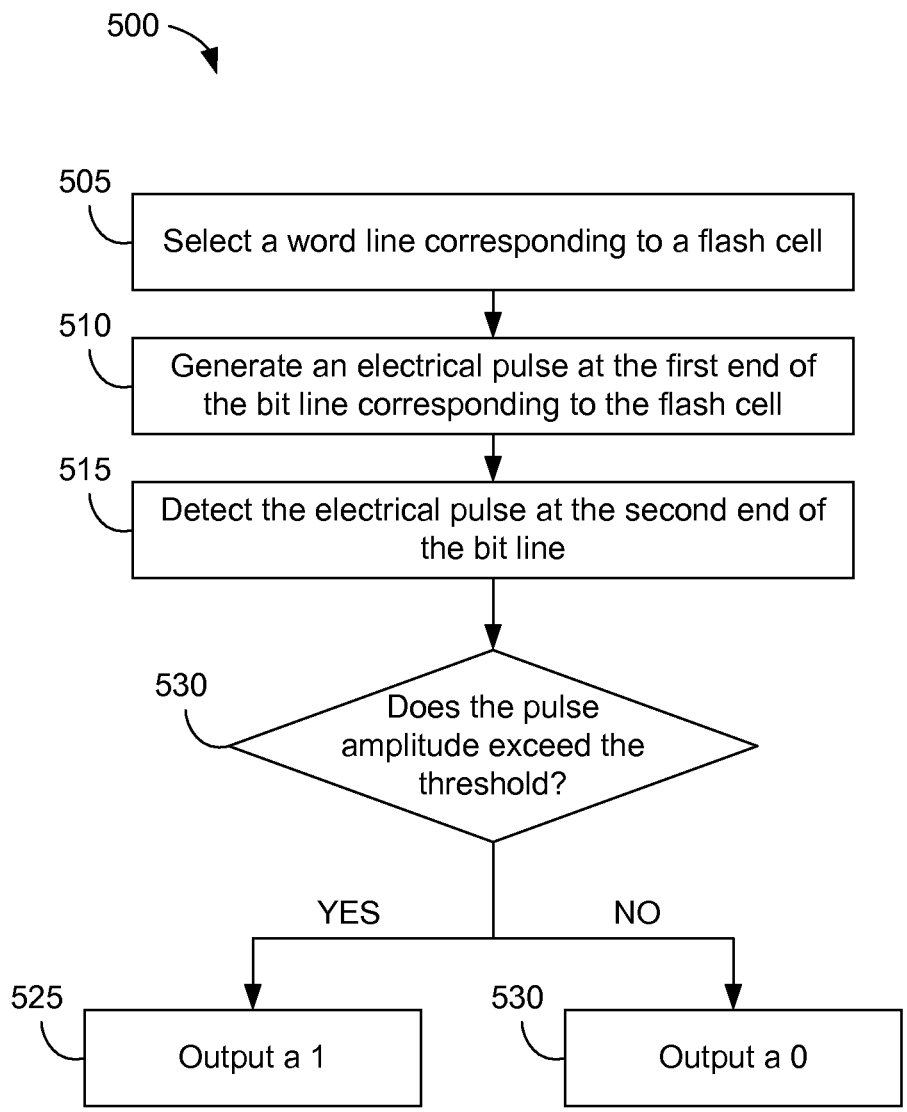
FIG. 5 depicts a flowchart diagram of one embodiment of a method for reading out a flash memory device.

FIG. 1 depicts a schematic diagram of one embodiment of a pulse-based memory read-out device 100. The depicted memory read-out device 100 includes various components, described in more detail below, that are capable of performing the functions and operations described herein. The memory read-out device 100 may include various components, such as a pulse generator 102 and a detector 104. The memory read-out device 100 may include more or fewer components or subsystems than those depicted herein. In some embodiments, the memory read-out device 100 may be used to implement the methods described herein as depicted in FIG. 5.

In one embodiment, the read-out device 100 is implemented in conjunction with a flash memory array in which memory cells 106 are arrayed in rows and columns referred to herein as word lines and bit lines 108, respectively. The memory cells 106 are configured to be set in either of two states—a high state and a low state—corresponding to a binary data value. According to one configuration, the high state may correspond to a binary one and the low state may correspond to a binary zero, as interpreted by the memory read-out device 100 or other components of a computer system. In various embodiments, the memory cells 106 may be one-transistor flash cells, two-transistor flash cells or any type of flash cells.

In one embodiment, the memory read-out device 100 includes a word line driver 110 configured to select a word line corresponding to a specific memory cell 106. The word line includes memory cells 106 configured to store related data bits. A bit is a unit of information that is represented by a binary one or zero, and set of related bits that are processed together as a single unit is referred to herein as a word. Each word is processed in a single word line and includes a predetermined, finite number of data bits. Thus, when accessing a specific memory cell 106, the word line driver 110 selects the word line associated with the word in which the selected memory cell 106 is located in the array. In one embodiment, the word line driver 110 selects the word line by applying a predetermined voltage to the control gates of the memory transistor or the access transistor in the memory cell 106, depending on the configuration of the memory cell 106.

The bits for each word line are contained in different bit lines 108. When the word line for the selected memory cell 106 is selected, the bit line 108 for the selected memory cell 106 is then selected. The bit line 108 is selected by generating an electrical pulse 112 at the first end of the bit line 108 and sending the pulse 112 along the bit line 108 from the first end to the second end of the bit line 108. Because a word line is already selected (biased to the appropriate voltage level), current from the pulse 112 is able to flow through the memory cell 106, which affects the current and voltage of the pulse 112 that continues along the bit line 108 to the second end of the bit line 108. The detector 104 receives the pulse 112 at the second end and determines the state of the selected memory cell 106 based on the properties of the pulse 112 as received at the second end relative to the properties of the pulse 112 as generated by the pulse generator 102 at the first end. The bit line 108 exhibits resistive and capacitive properties that allow the memory cell 106 to sink or draw current from the generated pulse 112, such that the pulse 112 has less current and lower voltage at the second end than at the first end.

A memory cell 106 having high-Vt sinks a comparatively small amount of current, having a small effect on the amplitude of the pulse 112. A memory cell 106 having low-Vt sinks a larger amount of current than a high-Vt cell, resulting in a greater effect on the amplitude of the pulse 112. Thus, in one embodiment, the detector 104 is able to determine that the memory cell 106 is high-Vt or low-Vt by examining the amplitude of the pulse 112. The detector 104 may compare the amplitude to a minimum threshold. If the amplitude is at or above the minimum threshold, the detector 104 outputs a binary value corresponding to the high-Vt state because the memory cell 106 did not draw a large amount of current from the pulse 112. If the amplitude is below the minimum threshold, the detector 104 outputs a binary value corresponding to the low-Vt state because the memory cell 106 drew a larger amount of current from the pulse 112. In one embodiment, the high-Vt state is represented by a binary one and the low-Vt state is represented by a binary zero. In another embodiment, the detector 104 may use a different representation for the states of the memory cells 106.

The minimum threshold may be determined by using the peak input amplitude corresponding to a selected memory cell 106 in the low-Vt state. The minimum threshold may be optimized to account for current leakage or other errors in the circuit so that the detector 104 outputs a digital value corresponding to a high-Vt cell—for example, a binary one—only when the pulse amplitude exceeds the minimum threshold. In one embodiment, anytime a pulse having an amplitude less than the threshold is received at the detector 104, the detector 104 outputs the value corresponding to a low-Vt cell—for example, a binary zero. In one embodiment, the threshold is set between 60 percent and 70 percent of the original amplitude of the pulse 112 at the pulse generator 102. In other embodiments, the threshold may be set to some other percentage of the initial amplitude, depending on the memory cells 106 and/or bit line properties.

Figure 2:
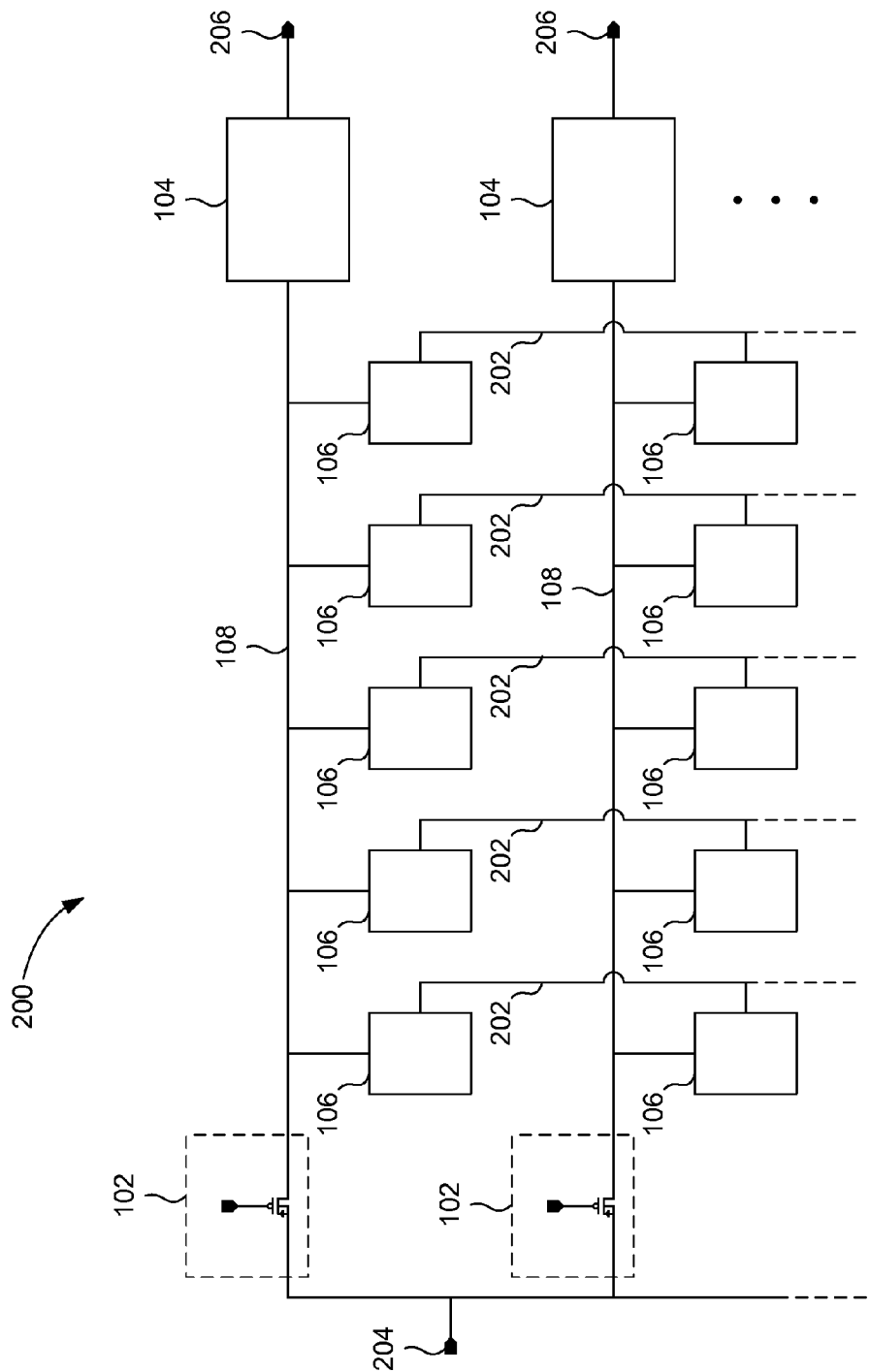
FIG. 2 depicts a schematic diagram of one embodiment of a flash memory device.

FIG. 2 depicts a schematic diagram of one embodiment of a flash memory device 200. While the memory read-out device 100 is described herein in conjunction with the flash memory device 200 of FIG. 2, the memory read-out device 100 may be used in conjunction with any flash memory device 200.

The flash memory device 200 may be an embedded device configured in a very-large-scale integration memory array. Flash memory devices 200 typically have a very large number of bit lines 108 and word lines 202. Each bit line 108 and each word line 202 may include as many memory cells 106 as needed for the specific configuration of the memory device. The flash memory device 200 of FIG. 2 may include any number of bit lines 108, though only two are shown in the present embodiment.

The flash memory device 200 may include a pulse generator 102 at the first end of each bit line 108 and a detector 104 at the second end of each bit line 108. In one embodiment, the pulse generator 102 includes a simple p-type metal-oxide-semiconductor (PMOS) transistor. A PMOS transistor provides a simple and relatively inexpensive way to generate a pulse 112 at the first end of the bit lines 108. In other embodiments, the pulse generator 102 may include different or other circuitry or components. The PMOS transistor passes the supply voltage 204 to the bit line 108 when the voltage for a control signal trigger applied to the control gate of the PMOS transistor is low. The control signal trigger may be low for a period of time sufficient to allow a predetermined electrical pulse 112 flow through the PMOS transistor. The control signal trigger may then be returned to a high value, thereby preventing any additional current from flowing through the PMOS transistor. In another embodiment, the pulse generator 102 may be an n-type metal-oxide-semiconductor (NMOS) transistor. The supply voltage 204 and other configurations of the flash memory device 200 may be different than with a PMOS transistor.

In one embodiment, the gate for each PMOS transistor is controlled separately from other PMOS transistors, which may allow the flash memory device 200 to access memory cells 106 one bit line 108 at a time. In some embodiments, the flash memory device 200 may be capable of accessing multiple bit lines 108, and therefore multiple memory cells 106, at the same time.

In one embodiment, the detectors 104 at the second end of each bit line 108 are digital detectors that detect any pulses 112 generated on the respective bit lines 108 and output a digital signal 206 resulting from comparing the voltage amplitude of the pulse 112 to the minimum threshold. The digital detectors may be CMOS circuits. Consequently, the detectors 104 may only output a signal in response to receiving a pulse 112 on the corresponding bit line 108. In one embodiment, the detectors 104 may output a default value unless the pulse 112 meets or exceeds the minimum threshold. In other embodiments, the detectors 104 may be analogue detectors.

In many flash memory devices 200, crosstalk between electrical lines in the memory array can cause potential issues that are typically overcome in conventional devices using current sensing. Crosstalk includes undesired transfer of signals between the lines in the memory array. Two types of crosstalk that are relevant to flash memory arrays include crosstalk from bit line 108 to bit line 108 and crosstalk from word line 202 to bit line 108. These issues may be overcome by applying several techniques: bit line scrambling and correct word selection timing.

Bits assigned to memory cells 106 in a single word are typically separated into different bit lines 108, and bits corresponding to the same position are grouped in a single bit line 108—e.g., bits in the first position in the word are grouped together in a bit line 108, bits in the second position are grouped together in a bit line 108, etc. Bit line scrambling is implemented by assuring that no two neighboring bits are positioned next to each other in the memory array. Bit lines 108 containing neighboring bits in a given word are separated by at least one other bit line 108. For example, the bit line 108 containing the bits in the first position of a group of words cannot be next to the bit line 108 containing the bits in the second position of the same group of words. This prevents crosstalk between neighboring bits in a word.

Crosstalk from word line 202 to bit line 108 may be prevented by ensuring the correct timing of the word line selection signal from the word line driver 110. The word line 202 for the selected memory cell 106 must be selected before the pulse generator 102 releases the pulse 112 on the bit line 108.

Figure 3A:
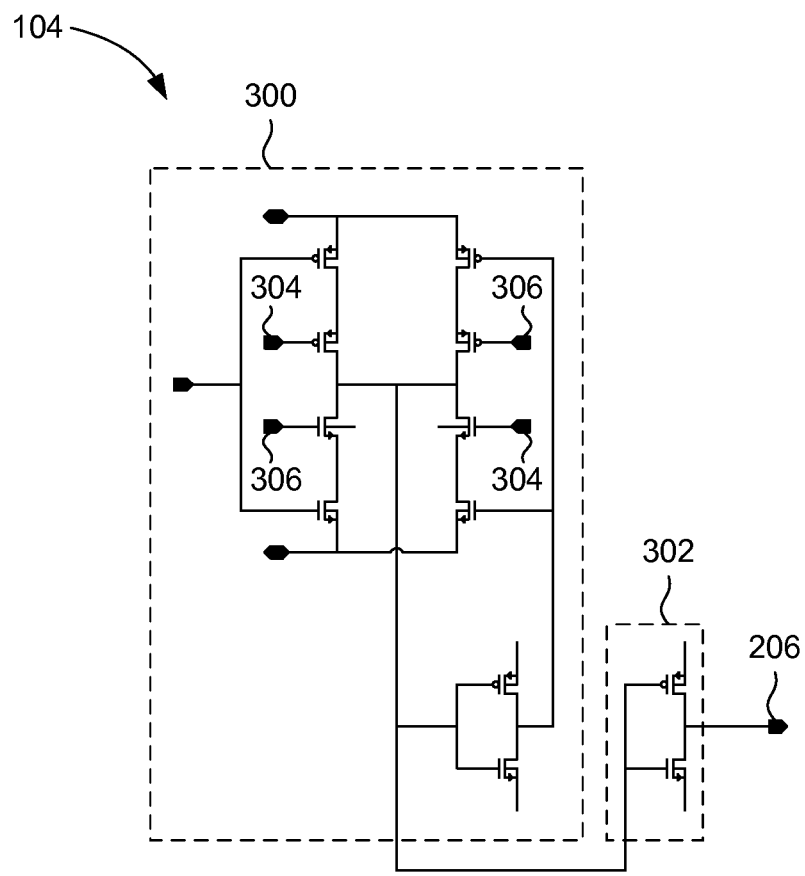
FIGS. 3A-3B depict a schematic diagram of one embodiment of the detector of FIG. 1.
Figure 3B:
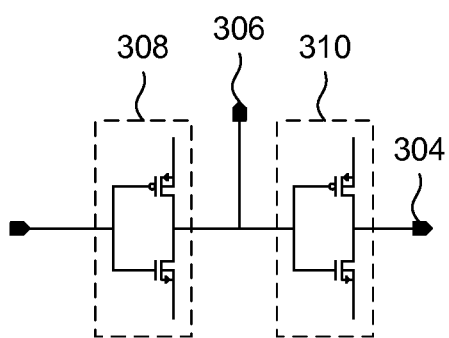
Figure 4:
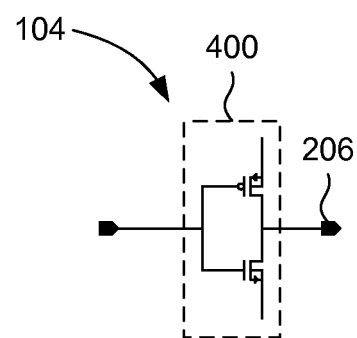
FIG. 4 depicts a schematic diagram of one embodiment of the detector of FIG. 1.

FIGS. 3A, 3B, and 4 depict schematic diagrams of various embodiment of the detector 104 of FIG. 1. While the memory read-out device 100 is described herein in conjunction with the detector 104 of FIGS. 3 and 4, the memory read-out device 100 may be used in conjunction with any detector 104.

In one embodiment, the detector 104 includes a standard digital latch 300, as shown in the embodiment of FIG. 3. The digital latch 300 has an input trip point that determines the point at which the digital latch 300 flips from a first output value to a second output value. The input trip point is optimized to correspond to the minimum threshold for the detector 104, such that the latch 300 flips from the first output value to the second output value in response to receiving an input voltage of an input signal that exceeds the input trip point. If the input voltage dips below the trip point, the output of the digital latch 300 flips back to the output value. As long as the input voltage remains below the threshold, the input signal will not trigger the trip point of the digital latch 300, and the digital latch 300 will output the first value. Alternative embodiments of a digital latch 300 may be implemented with the memory read-out device 100.

The input trip point of the digital latch 300, when set to the minimum threshold, must be larger than the peak input voltage for a pulse 112 on a bit line 108 with a selected memory cell 106 in a low-Vt state. A memory cell 106 in a low-Vt state sinks more current, and therefore has a greater effect on the amplitude of the pulse 112, than a memory cell 106 in a high-Vt state. By determining the threshold to be above the peak voltage for the low-Vt case and setting the input trip point for the digital latch 300 accordingly, the detector 104 may be able to accurately detect when the selected memory cell 106 is in the low-Vt state and when the selected memory cell 106 is in the high-Vt state. The input trip point may also be set to account for current leakage on the bit line 108 or other variables that may affect the peak voltage for the low-Vt case, such as degradation of the flash cells 106, impedance or capacitance of the bit line 108, or others. The input trip point may also have sufficient margin between the trip point and the peak voltage to account for such variables.

In one embodiment, because the output of the digital latch 300 is a digital signal 206, an inverter 302 may be added to the output of the digital latch 300 to reverse the polarity of the output signal. The digital signal 206 may allow for a simple method of outputting a desired representation for the states of the memory cells 106 with a small amount of simple circuitry. In one embodiment, the latch 300 includes a pair of inverters 308, 310, as shown in FIG. 3B, that create internal control signals 304, 306 required for proper function of the latch 300.

Alternatively, the detector 104 may include a plain inverter 400 at the second end of the bit line 108, as shown in FIG. 4.

The inverter 400 receives the pulse 112 sent from the pulse generator 102 at an input and outputs an inverted signal according to the trip point of the inverter 400. The trip point of the inverter 400 determines at what voltages the inverter 400 outputs a binary zero or a binary one. When the inverter 400 receives a pulse 112 for reading out the selected memory cell 106 in a low-Vt state, the inverter 400 may output a binary one due to flipping the value of the input pulse 112, which has a peak voltage lower than the trip point of the inverter 400. The inverter 400 may output a binary zero for a read-out of the selected memory cell 106 in a high-Vt state. If the outputs of the inverter 400 are opposite the desired value to represent a low- or high-Vt state, the detector 104 may include another inverter 302 at the output of the first inverter 400 to flip the binary output to the appropriate value. Other configurations of inverters 400 may be used.

In one embodiment, the performance of the memory read-out device 100 described herein may be optimized by tuning the impedance of the bit line 108, which may also affect the minimum threshold of the detector 104. An optimized flash memory device 200 may allow read-outs to be performed with a relatively low supply voltage 204, which may improve the performance and power consumption of the flash memory device 200. Tuning the impedance of the bit line 108 may be a simple and cost-effective way to tune the performance of the memory read-out device 100.

FIG. 5 depicts a flowchart diagram of one embodiment of a method for reading out a flash memory device 200. Although the method is described herein in conjunction with the memory read-out device 100 of FIG. 1 and the flash memory device 200 of FIG. 2, the method may be used in conjunction with other memory read-out devices 100 and flash memory devices 200.

In one embodiment, the memory read-out device 100 includes two separate components to perform the biasing of the bit line 108 and the detection of the memory cell state (or sensing of the current through the memory cell 106). The memory read-out device 100 generates 510 an electrical pulse 112 at the first end of the bit line 108 having the selected memory cell 106. The selected memory cell 106 is located between the first end and the second end of the bit line 108. The electrical pulse 112 may be produced using simple circuitry, such as a transistor that allows a supply voltage 204 to pass through the transistor when a signal is applied to the control gate of the transistor. The pulse 112 may have a predetermined width and amplitude according to the configuration of the flash memory device 200.

In one embodiment, the word line 202 on which the selected memory cell 106 is located is selected 505 before generating the electrical pulse 112 on the corresponding bit line 108. This may help prevent crosstalk between the word line 202 and the bit line 108. Additionally, crosstalk between bit lines 108 in the memory array may be prevented by arranging the bit lines 108 in a scrambling pattern, so that neighboring bits in a given word are not placed in bit lines 108 next to each other in the memory array.

In one embodiment, the memory read-out device 100 detects 515 the electrical pulse 112 at the second end of the bit line 108 via a detector 104. The detector 104 may include a digital latch 300 or a plain inverter 302 or pair of inverters 302. The detector 104 outputs a digital signal 206 that represents the current state of the selected memory cell 106. The digital signal 206 is based on the amplitude of the electrical pulse 112 at the second end. Specifically, the value of the digital signal 206 may be a result of a comparison of the amplitude of the pulse 112 at the second end of the bit line 108 with the amplitude of the initial pulse 112 generated at the first end of the bit line 108.

The minimum threshold at which the detector 104 outputs a value corresponding to a memory cell 106 in a high-Vt state may be defined as a percentage of the amplitude of the initial pulse 112 at the first end. Thus, any pulse 112 at the second end that has an amplitude equal to or greater than the percentage defined by the minimum threshold is detected to be a result of the memory cell 106 in the high-Vt state. Conversely, any pulse 112 at the second end that has an amplitude less than the percentage defined by the minimum threshold is detected to be a result of the memory cell 106 in the low-Vt state. In one embodiment, the minimum threshold is in a range from 60% to 70% of the amplitude of the electrical pulse 112 at the first end of the bit line 108. Other embodiments of the detector 104 or memory read-out device 100 may have a minimum threshold at some other percentage or in some other range of percentages of the initial pulse amplitude.

To configure the detector 104 to output the appropriate values corresponding to the minimum threshold, the input trip point of the detector 104 may be optimized. The input trip point is the voltage level at which the detector 104 changes from a first output value to a second output value. In one embodiment, the input trip point of the detector 104 is set to be higher than a peak voltage of the electrical pulse 112 at the second end for a low-Vt state of the memory cell 106. The input trip point may be set with a predetermined margin above the peak voltage for the low-Vt case to allow for current leakage, device degradation, and other factors that may affect the operation of the device over time.

In one embodiment, the memory read-out device 100 determines 520 whether the amplitude of the pulse 112 exceeds the minimum threshold. The detector 104 includes outputs 525 a binary one in response to detecting that the amplitude of the electrical pulse 112 is equal to or higher than a minimum threshold, and outputs 530 a binary zero in response to detecting that the amplitude of the electrical pulse 112 is lower than the minimum threshold. An inverter 302 may be placed at the output of the detector 104 to flip the binary values for each state of the memory cell 106 depending on the configuration of the flash memory device 200 or other components interacting with the memory device.

Although the operations of the method(s) herein are shown and described in a particular order, the order of the operations of each method may be altered so that certain operations may be performed in an inverse order or so that certain operations may be performed, at least in part, concurrently with other operations. In another embodiment, instructions or sub-operations of distinct operations may be implemented in an intermittent and/or alternating manner.

In the above description, specific details of various embodiments are provided. However, some embodiments may be practiced with less than all of these specific details. In other instances, certain methods, procedures, components, structures, and/or functions are described in no more detail than to enable the various embodiments of the invention, for the sake of brevity and clarity.

Although specific embodiments of the invention have been described and illustrated, the invention is not to be limited to the specific forms or arrangements of parts so described and illustrated. The scope of the invention is to be defined by the claims appended hereto and their equivalents.

What is claimed is:

1. A pulse-based memory read-out device, comprising:
a pulse generator at a first end of a bit line, wherein the pulse generator is configured to send an electrical pulse along the bit line from the first end of the bit line; and
a detector at a second end of the bit line, wherein the detector is configured to:
detect the electrical pulse at the second end; and
output a digital signal representing a current state of a selected memory cell in the bit line, wherein the digital signal is based on an amplitude of the electrical pulse at the second end.

2. The device of claim 1, further comprising a word line driver configured to select a word line corresponding to the selected memory cell before the pulse generator sends the electrical pulse, wherein the word line comprises related memory cells from different bit lines.

3. The device of claim 1, wherein the detector comprises an input trip point higher than a peak voltage of the electrical pulse at the second end for a low-voltage state of the memory cell, wherein the input trip point is a voltage level at which the detector changes from a first output value to a second output value.

4. The device of claim 1, wherein the pulse generator comprises a p-type metal-oxide-semiconductor (PMOS) transistor configured to pass a supply voltage to the bit line in response to a control signal trigger.

5. The device of claim 1, wherein the digital signal comprises a binary value, wherein the detector outputs a binary one in response to detecting that the amplitude of the electrical pulse is equal to or higher than a minimum threshold, and wherein the detector outputs a binary zero in response to detecting that the amplitude of the electrical pulse is lower than the minimum threshold.

6. The device of claim 5, wherein the minimum threshold is in a range from 60% to 70% of the amplitude of the electrical pulse at the first end of the bit line.

7. A flash storage device, comprising:
an array of memory cells, wherein the memory cells are arranged in columns of bit lines and rows of word lines;
a pulse generator at a first end of each bit line, wherein each of the pulse generators is configured to send an electrical pulse along one of the bit lines from the first end of the bit line corresponding to the selected memory cell; and
a detector at a second end of each bit line, wherein each detector is configured to:
detect the electrical pulse at the second end of the corresponding bit line; and
output a digital signal representing a current state of the selected memory cell, wherein the digital signal is based on a voltage level of the electrical pulse at the second end of the corresponding bit line.

8. The device of claim 7, wherein bits corresponding to the memory cells are processed in words, wherein the bit lines are placed in the array using a bit line scrambling pattern in which separate bit lines comprising neighboring bits in a given word are separated by at least one other bit line.

9. The device of claim 7, further comprising a word line driver configured to select the word line corresponding to the selected memory cell before the pulse generator sends the electrical pulse.

10. The device of claim 7, wherein the detector comprises a digital latch.

11. The device of claim 7, wherein the detector comprises an inverter.

12. The device of claim 7, wherein the detector comprises an input trip point higher than a peak voltage of the electrical pulse at the second end for a low-voltage state of the memory cell, wherein the input trip point is a voltage level at which the detector changes from a first output value to a second output value.

13. The device of claim 7, wherein the pulse generator comprises a p-type metal-oxide-semiconductor (PMOS) transistor configured to pass a supply voltage to the bit line in response to a control signal trigger.

14. The device of claim 7, wherein the digital signal comprises a binary value, wherein the detector outputs a binary one in response to detecting that the amplitude of the electrical pulse is equal to or higher than a minimum threshold, and wherein the detector outputs a binary zero in response to detecting that the amplitude of the electrical pulse is lower than the minimum threshold.

15. The device of claim 14, wherein the minimum threshold is in a range from 60% to 70% of the amplitude of the electrical pulse at the first end of the bit line.

16. A method for reading out a flash memory device, the method comprising:
generating an electrical pulse at a first end of a bit line, wherein the bit line comprises a selected memory cell between the first end and a second end of the bit line;
detecting the electrical pulse at the second end via a detector; and
outputting a digital signal representing a current state of the selected memory cell, wherein the digital signal is based on an amplitude of the electrical pulse at the second end.

17. The method of claim 16, further comprising selecting a world line on which the selected memory cell is located before generating the electrical pulse.

18. The method of claim 16, further comprising setting an input trip point of the detector higher than a peak voltage of the electrical pulse at the second end for a low-voltage state of the memory cell, wherein the input trip point is a voltage level at which the detector changes from a first output value to a second output value.

19. The method of claim 16, wherein outputting the digital signal further comprises outputting a binary one in response to detecting that the amplitude of the electrical pulse is equal to or higher than a minimum threshold, and outputting a binary zero in response to detecting that the amplitude of the electrical pulse is lower than the minimum threshold.

20. The method of claim 19, wherein the minimum threshold is in a range from 60% to 70% of the amplitude of the electrical pulse at the first end of the bit line.

* * * * *